(12) United States Patent
Braun et al.

(10) Patent No.: US 8,704,076 B2
(45) Date of Patent: Apr. 22, 2014

(54) THERMOELECTRIC TEMPERING DEVICE

(75) Inventors: Ralf Braun, Herborn (DE); Lon E. Bell, Altadena, CA (US); Robert W. Diller, Pasadena, CA (US); Christoph Reitz, Eschenburg (DE)

(73) Assignee: Rittal GmbH & Co. KG, Herborn (DE)

( * ) Notice: Subject to any disclaimer, the term of this patent is extended or adjusted under 35 U.S.C. 154(b) by 811 days.

(21) Appl. No.: 12/450,825

(22) PCT Filed: Apr. 11, 2008

(86) PCT No.: PCT/EP2008/002890
§ 371 (c)(1),
(2), (4) Date: Aug. 10, 2010

(87) PCT Pub. No.: WO2008/125301
PCT Pub. Date: Oct. 23, 2008

(65) Prior Publication Data
US 2011/0017252 A1 Jan. 27, 2011

(30) Foreign Application Priority Data

Apr. 12, 2007 (DE) ................ 20 2007 018 397 U

(51) Int. Cl.
*H01L 35/30* (2006.01)
*H05K 7/20* (2006.01)
*H01L 35/32* (2006.01)
*F24F 5/00* (2006.01)

(52) U.S. Cl.
CPC ............. *H01L 35/32* (2013.01); *F28F 2210/08* (2013.01); *F24F 5/0042* (2013.01)

USPC .......................................................... 136/204

(58) Field of Classification Search
USPC .......................................................... 136/204
See application file for complete search history.

(56) References Cited

U.S. PATENT DOCUMENTS 2,949,014 A * 8/1960 Belton, Jr et al. ................ 62/3.2
5,431,021 A * 7/1995 Gwilliam et al. ................ 62/3.7
(Continued)

FOREIGN PATENT DOCUMENTS

DE 200 07 920 U1 11/2000
DE 200 13 775 U1 1/2001
(Continued)

Primary Examiner — Jennifer Michener
Assistant Examiner — Matthew Zapadka
(74) Attorney, Agent, or Firm — Pauley Petersen & Erickson

(57) ABSTRACT

A thermoelectric tempering device having a plurality of thermoelectrically operating tempering elements, including a cold surface, which forms upon the supply of an electric current, on one side thereof, and a warm surface on the opposite side thereof, including air/heat exchange bodies affixed on both sides and accommodated in a respective air flow chamber, and ventilators effecting an air flow along the same. Simple adjustment and expansion possibilities are provided with a unit of the tempering device configured as a tempering module and constructed so that the air flow chambers are configured as flow channels surrounding the heat exchange bodies parallel to the flow direction laterally and on the cover side facing away from the tempering elements, the flow channels having an air intake opening and an air discharge opening, wherein the ventilator of the respective flow channel is disposed on an intake opening or on a discharge opening.

38 Claims, 11 Drawing Sheets

(56) References Cited

U.S. PATENT DOCUMENTS

| | | |
|---|---|---|
| 6,181,556 B1 | 1/2001 | Allman |
| 6,301,901 B1 | 10/2001 | Coffee et al. |
| 6,345,507 B1 * | 2/2002 | Gillen ............... 62/3.7 |
| 6,672,076 B2 * | 1/2004 | Bell ............... 62/3.3 |
| 7,028,753 B2 * | 4/2006 | Sterner ............... 165/80.3 |
| 7,278,270 B2 * | 10/2007 | Culp et al. ............... 62/3.6 |
| 2006/0137359 A1 | 6/2006 | Ghoshal |

FOREIGN PATENT DOCUMENTS

| | | |
|---|---|---|
| DE | 102 18 343 B4 | 11/2003 |
| DE | 20 2005 009 581 U1 | 11/2005 |
| DE | 10 2006 020 499 B4 | 10/2007 |
| JP | 2000130909 A | 5/2000 |
| RU | 2 203 523 C2 | 5/2003 |
| RU | 2 288 555 C2 | 2/2005 |

* cited by examiner

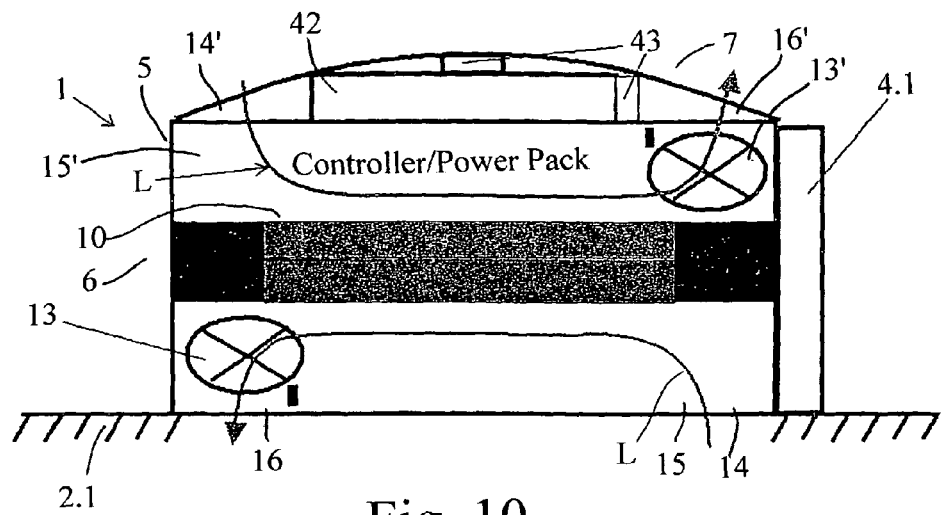
Fig. 10
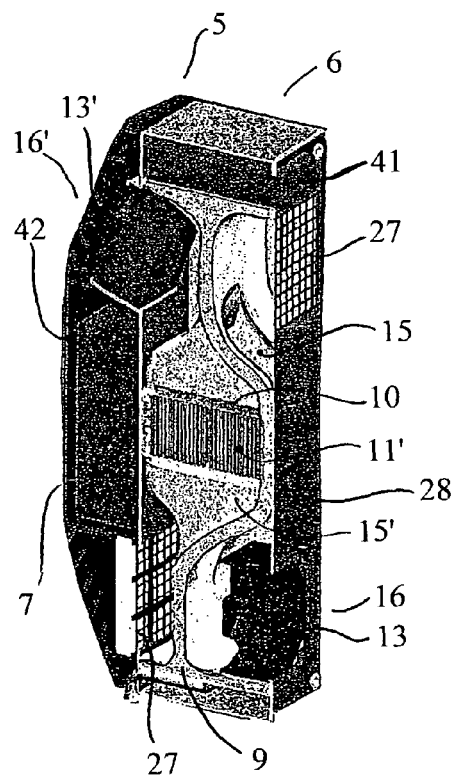
Fig. 11
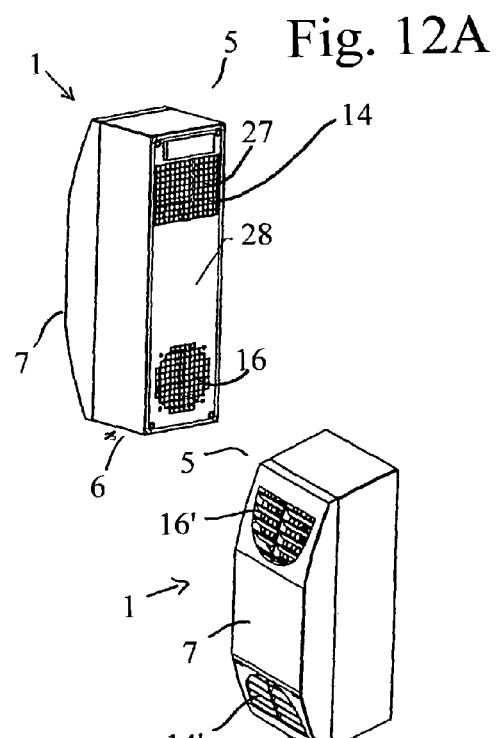
Fig. 12A
Fig. 12B

THERMOELECTRIC TEMPERING DEVICE

BACKGROUND OF THE INVENTION

1. Field of the Invention

This invention relates to a thermoelectric tempering device having a plurality of thermoelectrically operating tempering elements, one side of which includes a cold surface that forms upon the supply of an electric current while an opposite side comprises a hot surface, and air/heat exchange elements are affixed to both sides, each accommodated in a respective air flow chamber, and ventilators produce an air flow along these air/heat exchange elements.

2. Discussion of Related Art

A tempering device is disclosed in German Patent Reference DE 200 07 920 U1, in connection with a ventilating device for a housing, for example an electrical cabinet containing electronic equipment. This known ventilating device embodied as a roof unit is laid out as a flat, block-shaped unit equipped with a plurality of air flow chambers and among other things, has a heat exchange unit with at least one Peltier element that can cool or heat air flowing past one surface, depending on the selected flow direction of the electric current, while the other surface is conversely cooled or heated. This actively functioning Peltier heat exchange unit is preceded by a separate flow chamber with a heat exchanger in the flow path, which is preceded by a radial fan for supplying an internal air flow. In the heat exchanger, the internal air flow crosses an external air flow in order to exchange heat before the air then travels to the Peltier heat exchange unit, on the one hand, being subsequently vented to the surroundings by an axial fan and on the other hand, being conveyed in the form of tempered air into the electrical cabinet. In this embodiment, the Peltier heat exchange unit functions in an auxiliary fashion together with other tempering components of the ventilating device, in particular the preceding heat exchanger. The overall ventilating device, together with the air flow chambers forms a relatively bulky unit.

In another thermoelectric tempering device equipped with Peltier elements and disclosed in the previously unpublished German Patent Reference 10 2006 020 499.9, an increase in the efficiency is achieved in a flat, compact design because a flow conduit feeds into a multitude of partial flow conduits that lead to the heat exchanger elements in order to produce a heat transfer with air flowing through.

U.S. Patent Reference US 2006/0137359 A1 discloses a thermoelectric tempering device for cooling or heating, equipped with a plurality of Peltier element modules. Closed circuits filled with a heat transmitting fluid, such as liquid metal, are routed over the cold and hot surfaces. A heat exchanger can also be situated in the circuits. A fan unit with suitable cooling conduits is not provided in this design.

German Patent Reference DE 102 18 343 B4 discloses an electric tempering device equipped with Peltier elements for motor vehicles. In this case, only the one side of the Peltier elements is exposed to an air flow produced in a surrounding conduit. This air flow is conveyed into the interior of the vehicle while the other cool side is in thermal contact with power components of the drive unit. Consequently, no corresponding cooling conduit and relevant fan unit are provided on the second side.

Japanese JP 2000130909 A discloses another thermoelectric tempering device equipped with Peltier elements for cooling or heating. In this case, fans are provided that can be driven at different power levels. However, these are situated on the outside of a housing on a Peltier unit and are oriented perpendicular to its surface.

U.S. Pat. No. 6,181,556 B1 discloses another thermoelectric tempering device equipped with a plurality of thermoelectrically functioning tempering elements. In this known thermoelectric tempering device, a plurality of Peltier elements are connected to heat sinks that have fins on only one side and have fans mounted on them in order to cool a processor unit CPU or another semiconductor element, which is mounted on a circuit board and is brought into connection with the cooling device in a particular way or is enclosed by the latter. A thermally coupled bridge is also provided for the cooling. It is difficult to achieve a definite air flow with this design.

German Patent Reference DE 200 13 775 U1 discloses a thermoelectric tempering device, a cooling unit equipped with Peltier elements. In this case, chambers equipped with fans are situated on the hot side and the cold side of the Peltier element. Between the hot side and the relevant fan, a heat sink is provided, which dissipates the produced heat to the surrounding air and between the cold side and the relevant fan, another heat sink is provided, which is equipped with fins in order, together with the fan, to distribute the cooling action from the heat sink into the unit to be cooled. Here, it is difficult to achieve definite flow ratios in the various possible installations.

SUMMARY OF THE INVENTION

One object of this invention is to provide a thermoelectric tempering device of the type mentioned above but that users can employ for various purposes with as little difficulty as possible, in particular for cooling electrical cabinets or housings.

This object is attained with a thermoelectric tempering device having characteristics taught in this specification and in the claims. In this instance, the air flow chambers are formed as flow conduits that encompass the heat exchange elements laterally in the flow direction at their end remote from the tempering elements and have an air inlet opening and an air outlet opening, with the fan of the respective flow conduit being situated at its respective inlet opening or outlet opening.

These measures yield a compact design with a modular construction that can be easily expanded and adapted to different requirements. For example, the space-saving, compact design provides advantageous installation possibilities in an electrical cabinet containing built-in electronic components or also in smaller housings. Other uses are also possible, for example a cooling of surfaces or substances of various types. In addition to the compact, flat, and thus inexpensive design, a high efficiency and a low weight are achieved in comparison to conventionally designed devices. As known, the tempering can comprise a cooling or heating of the air conveyed past, depending on the selected electric current direction of the relevant tempering elements.

Various embodiments of the design have fans integrated into the side of the unit, next to the relevant heat exchange element, both on the same side of the tempering module or on opposite sides of it.

A flat, compact design and a high efficiency are facilitated if the two fans are each embodied as a radial fan whose radial flow opening is oriented toward the respective heat exchange element and whose axial flow opening is oriented perpendicular to the flat side of the tempering elements, with the radial flow opening situated on the side, next to the respective heat exchanger element, or if each respective fan is embodied as an axial fan and the respective flow conduit, in its region oriented toward the relevant axial fan, has a directional component oriented in the axial direction of the radial fan.

In various embodiments, with regard to the associated flow conduit, both fans are embodied as blowing fans, both fans are embodied as suction fans, or one fan is embodied as a suction fan while the other fan is embodied as a blowing fan.

Other embodiments that are favorable for the function and variable arrangement possibilities are comprised in that the air flows either in opposite directions or in the same direction through the flow conduit associated with the cold surface and also the flow conduit associated with the hot surface.

A design that is advantageous in terms of a maximum possible efficiency is achieved if the heat exchange elements are equipped with fins oriented perpendicular to the cold surface or the hot surface and parallel to the flow of air through the relevant flow conduit.

The tempering capacity, such as for an electrical cabinet or larger housing containing electrical equipment that generates a high amount of thermal dissipation loss, can be advantageously increased in that a unit, which is embodied as a tempering module and is part of the tempering device, has a coupling device situated in at least one edge section in the vicinity of the circumference edge, by which it is possible to attach a correspondingly embodied additional tempering module equipped with a complementary coupling device. In this case, a reliable coupling is achieved if each tempering module has a coupling device in one edge section and a complementary coupling device in another edge section.

Advantageous expansion options are achieved if each tempering module has a coupling device in one edge section and a complementary coupling device in another edge section. The outer contour of the tempering module can be different, but it is advantageous for it to be rectangular or square viewed from above so that, for example with a coupling device and complementary coupling device situated in the narrow edge sections on opposite sides of a tempering module, simple expansion options are achieved by attaching additional tempering modules in sequence, thus achieving a cascading and scaling of the tempering capacity.

An easy-to-achieve interconnection of a plurality of tempering modules is facilitated if the coupling device is equipped with mechanical coupling components or means and electrical coupling components and also by the fact that the electrical coupling components have at least one plug/coupling unit for electrically coupling signal lines and/or power supply lines.

In various embodiments, the mechanical coupling components or means have plug connection elements, detent connection elements, screw connection elements, and/or magnetic connection elements.

The design and operation of the tempering device are facilitated if a control unit with a control module is provided, which is electrically connected or connectable to a tempering module or a group of them and is embodied so that it is possible to control or regulate a tempering module and/or a plurality of tempering modules in connection with different levels of tempering capacity.

Variable use and operation possibilities are also facilitated if the control unit is embodied so that it is possible to control or regulate different tempering capacities by driving the fans at different speeds and/or by varying the control of the power supply to the tempering elements.

Additional advantageous control possibilities for the tempering are achieved if the control unit is able to control the tempering modules differently from one another.

An efficient tempering is facilitated if the control unit is embodied so that it is able to drive the fans with different levels of electrical power and to drive the tempering elements with different levels of electrical power in order to meet various tempering capacity requirements and by the fact that the driving of the fans and the driving of the tempering elements are matched to each other so as to minimize the total electrical power demand for driving the fans and tempering elements at the respective tempering capacity. To this end, it is also advantageous if the control unit has at least one controller embodied as a microcontroller, which has programs stored on it for producing signals for driving the fans and tempering elements as a function of sensor signals that communicate the tempering capacity requirement.

An adaptation to different requirements is also facilitated if an electric power supply with at least one power supply module is provided, which each is embodied for supplying power selectively to a single tempering module or to a group of tempering modules.

In one embodiment, the control unit has at least one control module with its own housing and the control module and/or each power supply module has a coupling device for electrically and/or mechanically coupling to one more tempering modules.

A design that is advantageous for the function and use has a tempering module having a housing with a housing bottom part and a housing top part and the tempering elements, heat exchange elements, and fans are situated and secured in the housing bottom part.

In one embodiment, the flow conduits are situated in the housing bottom part.

The manufacture, function, and usability are facilitated if the housing bottom part is block-shaped and has a detachably mounted housing bottom on its underside and is covered on its opposite surface by the housing top part. The housing bottom contains an inlet opening and an outlet opening flow-connected to it via a flow conduit possibly including a plurality of branch conduits. The housing top part contains another inlet opening and another outlet opening flow-connected to it via another flow conduit possibly including a plurality of branch conduits.

A compact design with a favorable degree of manageability is facilitated if the housing top part protrudes outward like a dome on top and in its longitudinal section, is trapezoidal or arched convexly outward and a receiving chamber is formed between a middle section of the housing top part and an intermediate wall in the upper region of the housing bottom part oriented toward the top housing part. An electric power supply, in particular a power pack, is accommodated in this receiving chamber.

The production, with advantageous accommodation and adaptation of flow conduits as a function of the remaining elements of the air flow routing and the tempering, is facilitated if a housing insert with block-shaped outer contours is inserted into the housing bottom part and the flow conduits are embodied in the housing insert. The housing insert can be manufactured, for example, of a heat-resistant, stable plastic material.

A compact design with a favorable degree of manageability is also facilitated if the housing insert is shortened in its longitudinal direction in comparison to the housing bottom part and if the controller is accommodated in the space between a narrow outside of the housing insert and the narrow inside of the housing bottom part oriented toward it.

Other advantages for the function and use are achieved if an optical indicator is installed in an upper covering wall of the housing top part.

BRIEF DESCRIPTION OF THE DRAWINGS

This invention is explained in greater detail below in view of exemplary embodiments shown in the drawings, wherein:

FIG. 10 is a schematically depicted longitudinal section taken through another embodiment of a tempering module, mounted on a housing wall;

FIG. 11 is a perspective view of a longitudinal section taken through another embodiment of a tempering module according to FIG. 10;

FIGS. 12A and 12B are perspective top and bottom views of the tempering module according to FIG. 11;

DETAILED DESCRIPTION OF THE INVENTION

Figure 1:
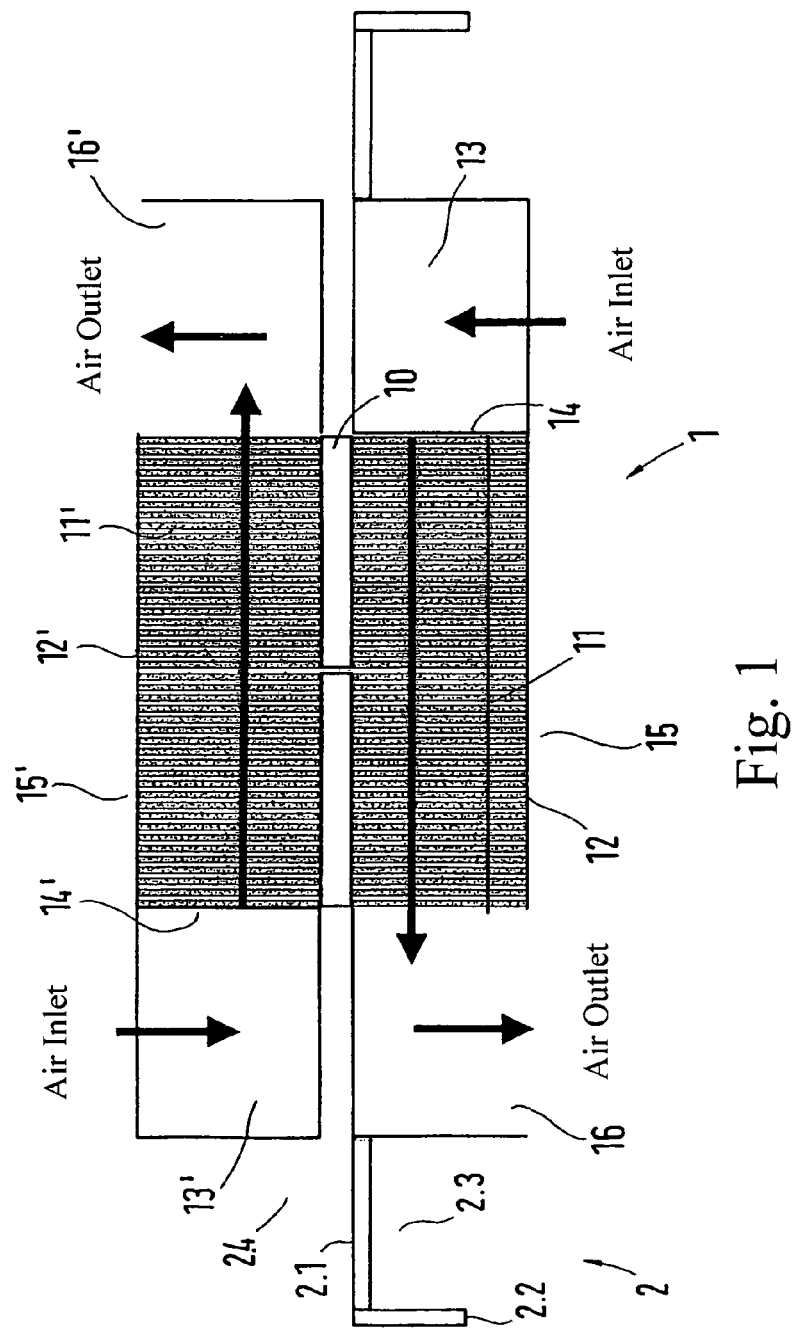
FIG. 1 is a schematically depicted longitudinal section taken through a tempering module installed in an electrical cabinet wall.

FIG. 1 shows a tempering module 1 of a thermoelectric tempering device, built into a rear wall 2.1 of an electrical cabinet 2. A part of the tempering module 1 is positioned or situated within the interior 2.3 of the electrical cabinet 2 delimited laterally by the side walls 2.2 while the other part is positioned or situated on the exterior 2.4 of the electrical cabinet 2. The part of the tempering module 1 oriented toward the interior 2.3 tempers the interior air of the electrical cabinet 2 in order, for example, to cool the interior air heated by the lost heat from electrical components and to maintain a particular temperature level. If the interior temperature is too low, the tempering module 1 can also be used to heat the interior air by reversing the flow direction. Similar built-in components of the tempering module 1 can also be provided in smaller interiors, such as in housings, and it is also possible for the tempering module 1 to be used in connection with surfaces to be cooled or materials of other kinds.

The tempering module 1 preferably has a plurality of thermoelectric elements, in particular Peltier elements 10, which, in an intrinsically known fashion, generate cold on one flat side and heat on an other flat side when an electric current flows through them. The cold side and hot side can be reversed by reversing the flow direction.

The cold surface and hot surface of the tempering elements 10 have heat exchange elements 11 and 11' mounted to them, with fins extending perpendicular to the respective surface. For a clear depiction of the fin shape, these fins are shown or depicted perpendicular to the plane of the drawing in FIG. 1, and also in FIGS. 3, 4, and 6, but actually, they extend parallel to the flow direction, indicated by the arrows, of the air conveyed through the heat exchange elements 11 and 11'. By the fins, the exchange element 11, 11' produces a heat exchange between the relevant surfaces of the tempering elements 10 with a high degree of efficiency, particularly if the heat exchange element 11, 11' is composed of or comprises a material with a good thermal conductivity such as aluminum or copper.

Each of the heat exchange elements 11, 11', on its side covered by the respective cold or hot surface of the tempering elements 10 and on both of its sides extending parallel to the flow direction of the air flowing through the fins, is encompassed by a respective conduit covering 12, 12' and lateral wall sections that are spaced a short distance apart from it in order to form a respective flow conduit 15, 15', thus achieving an effective guidance of the air to flow through the heat exchange element 11, 11', along the surfaces of the fins. The flow conduit extends parallel to the cold or hot surface of the tempering elements 10 and at the one end, has an air inlet opening 14, 14' in a plane oriented vertically in relation to the cold or hot surface of the tempering elements 10 and perpendicular to the flow direction and at its opposite end 14, 14', has an air outlet opening 16, 16'. At the air inlet end of the flow conduit 15, 15' a respective fan 13, 13' is provided, which blows air through the respective flow conduit 15, 15' with the heat exchanger 11, 11' and this air, after flowing out through the air outlet opening 16, 16', at one end, flows out in a tempered state into the interior 2.3 of the electrical cabinet and at the other end, is conveyed out to the exterior 2.4. For example, the fans 13, 13' are embodied as radial fans that draw the air in axially and blow it into the flow conduit 15, 15' through a radial opening with which they are connected to the flow conduit in a sealed fashion. In this way, the air to be tempered in the interior 2.3 of the electrical cabinet 2 is brought to the required temperature with a high degree of efficiency. This design also yields a compact, relatively flat structure.

Figure 2:
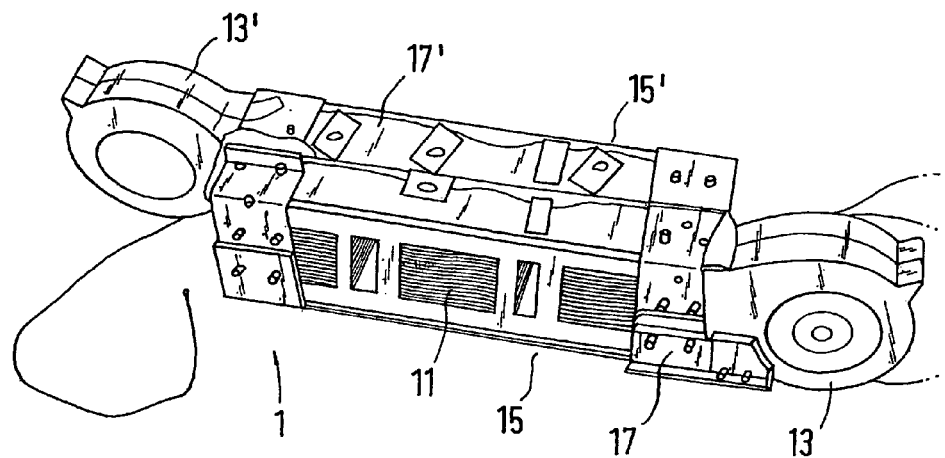
FIG. 2 is a perspective view of a tempering module according to FIG. 1.

As shown in FIG. 2, the fans 13, 13' are each coupled to the flow conduit 15, 15' by a respective conduit section 17, 17'. Similar conduit sections are also provided at the air outlet opening 16, 16'. The conduit sections at the outlet end can convey the air perpendicular, for example, to the flow direction prevailing in the flow conduit 15, 15', as is also the case at the inlet end, where the air enters into the relevant fan 13, 13' perpendicular to the flow direction in the conduit.

In the exemplary embodiment according to FIGS. 1 and 2, the fan associated with the cold surface of the tempering elements 10 on the one hand and the fan associated with their hot surface on the other hand are situated at opposite ends of the flow conduit 15, 15' and, because of the blowing embodiment of the fans 13, 13', the flow direction is oriented in opposite directions in the two heat exchange elements 11, 11', as indicated by the flow arrows.

Figure 3:
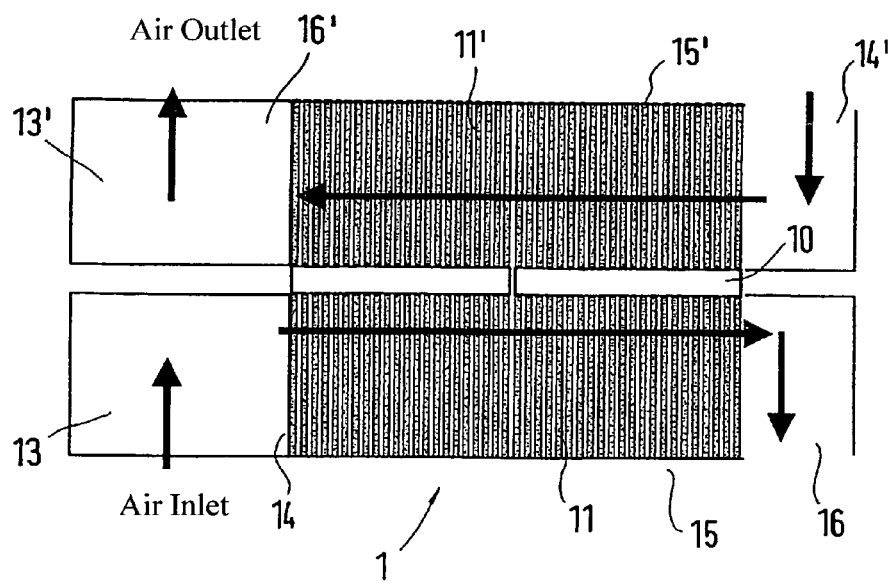
FIG. 3 is a schematically depicted longitudinal section taken through another exemplary embodiment for a tempering module.

A counterflow principle of this kind is also used in the exemplary embodiment of the tempering module 1 shown in FIG. 3. By contrast with the exemplary embodiment according to FIGS. 1 and 2, the one fan, in this case the fan associated with the interior of the electrical cabinet, is embodied as a blowing radial fan while the other fan, in this case the fan 13' associated with the exterior 2.4, is embodied as a suction radial fan. The air is drawn through the radial opening of the fan, through the air inlet opening 14', the flow conduit 15', and the air outlet opening 16' and is conveyed axially outward by the fan 13'.

Figure 4:
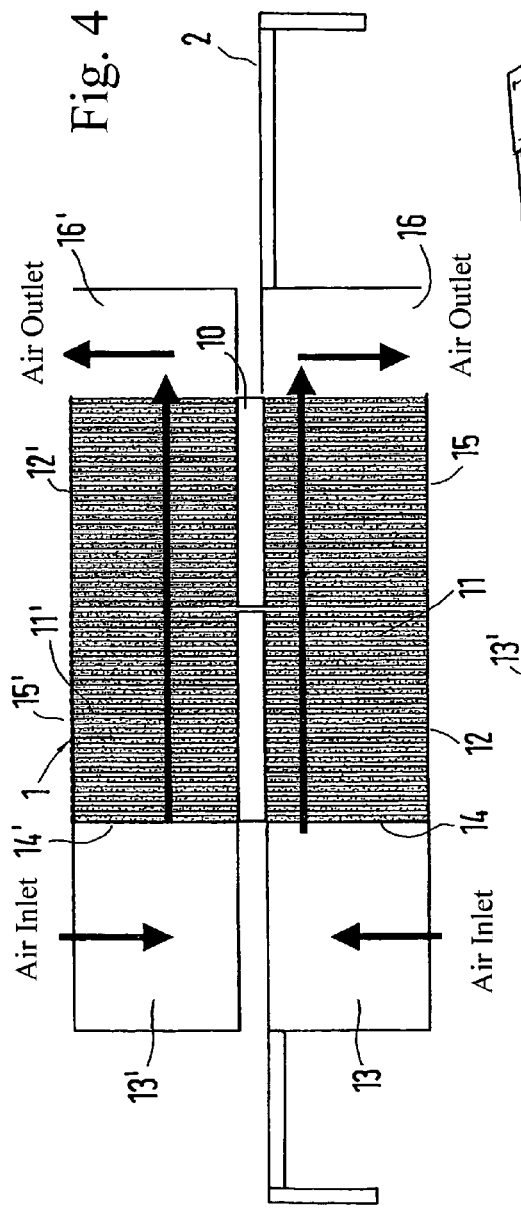
FIG. 4 is a schematically depicted longitudinal section taken through another exemplary embodiment for a tempering module installed in an electrical cabinet wall.
Figure 5:
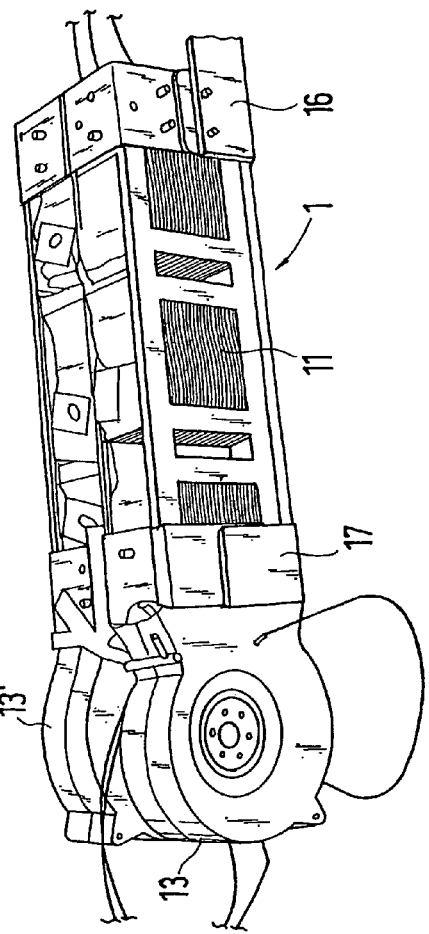
FIG. 5 is a perspective view of the tempering module according to FIG. 4.

In the exemplary embodiment of the tempering module 1 shown in FIGS. 4 and 5, which is installed, for example, in the rear wall of the electrical cabinet 2, the two fans 13, 13' of the respective cold and hot surfaces of the tempering elements 10 are likewise connected to the same end of the tempering module 1, each to its respective flow conduit 15, 15'. In this case, the two fans 13, 13' are again embodied as blowing fans, preferably radial fans, thus producing a design of the tempering module 1 that functions in accordance with the parallel flow principle, as indicated by the flow arrows in FIG. 4. This produces a more compact design than in the exemplary embodiment according to FIG. 1 because of the arrangement of the blowing fans at the same end of the tempering module 1, but as a rule, a lower level of efficiency is achieved than with the counterflow principle in which a more constant temperature distribution prevails over the entire cross-section.

Figure 6:
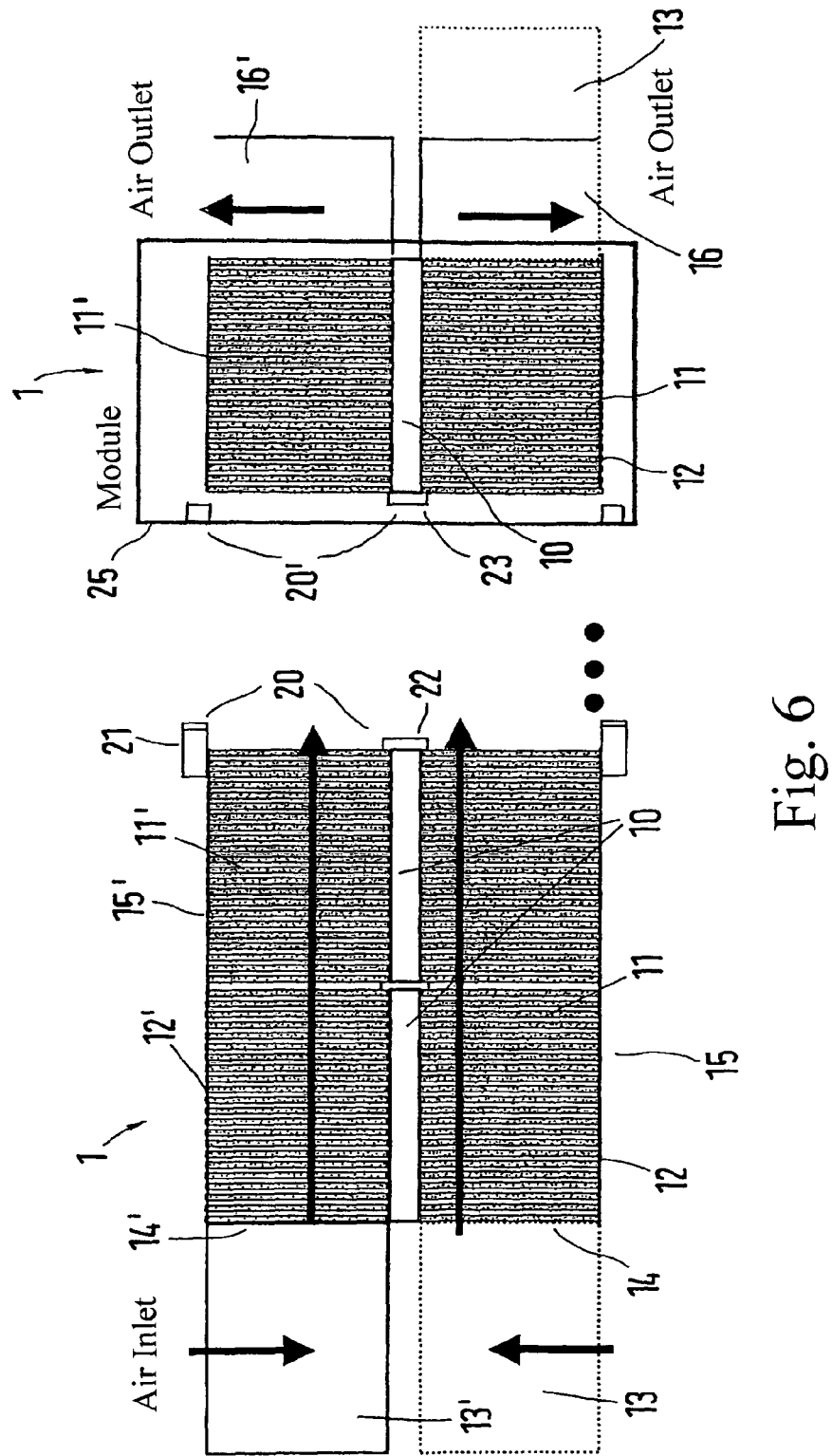
FIG. 6 is a schematic view of a plurality of tempering modules to be combined into a unit.

FIG. 6 shows the possibility of combining a plurality of tempering modules 1. The fans 13, 13' are positioned or situated, for example, at one end of the combined unit composed of a plurality of tempering modules 1 and produce a flow through the tempering modules 1 that are arranged in series with one another in the flow direction. To permit the tempering modules 1 to be coupled to one another as closely as possible, the conduit sections 17, 17' of the adjoining tempering modules 1 can be removed. To promote the flow of air, particularly with conduits that are long, blowing fans can be situated at one end of the conduit and suction fans can be situated at the other end of the same conduit.

Figure 9:
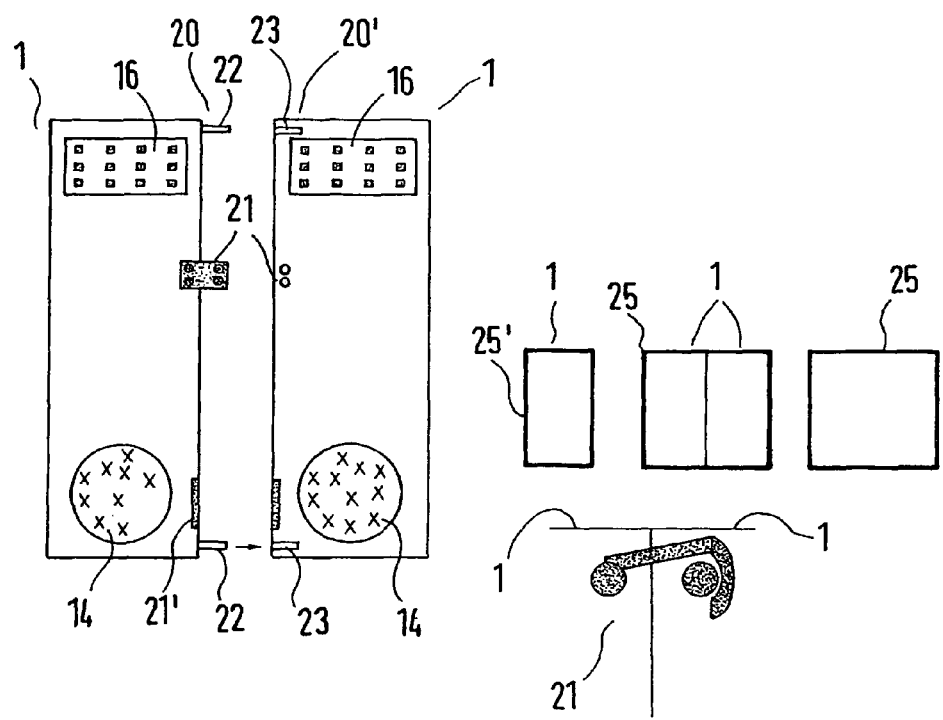
FIG. 9 is a schematic view of a plurality of tempering modules to be combined into a unit, equipped with a coupling device.
Figure 13A:
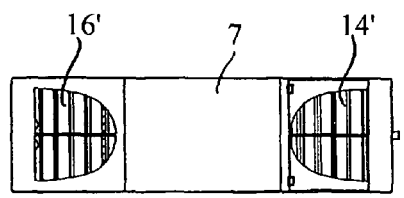
FIGS. 13A through 13G show various views of the tempering module according to FIG. 11, namely a top view, a longitudinal section, a view from the right, two cross-sectional views taken along the intersecting planes B-B and C-C, and a side view.
Figure 13B:
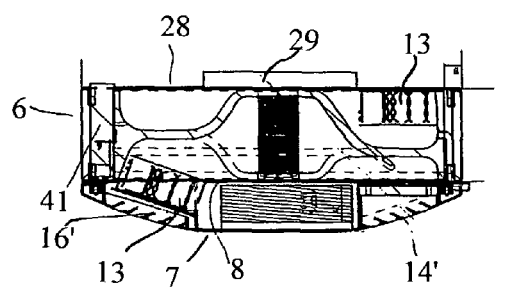
Figures 13C, 13D, 13E, 13F:
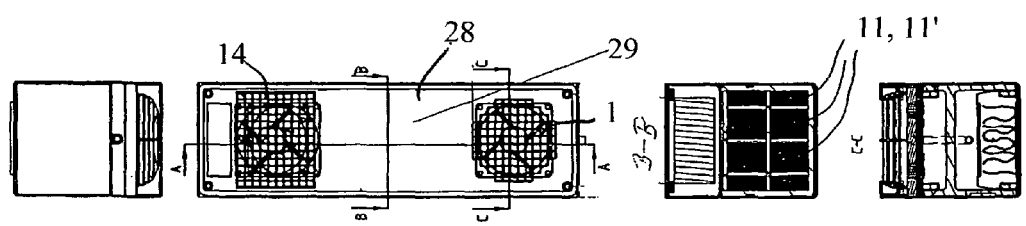
Figure 13G:
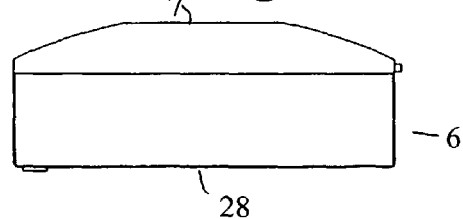

To permit simple production of the coupling connection, a coupling device 20, 20' with mechanical coupling or coupling means 21, 21' and/or electrical coupling components 22, 23 is provided at the associated ends of the tempering modules 1. The mechanical coupling means 21 and electrical coupling components 22 on the one tempering module 1 are embodied to complement the mechanical coupling means 21' and electrical coupling components 23 on the other tempering module 1. This achieves a secure mechanical coupling with a reliable electrical connection of the tempering modules 1 that are arranged in series with one another. The coupling device 20, 20' can advantageously be mounted on a supporting section or a section of a frame 25, 25', as shown in FIG. 9. In a similar fashion, as shown in FIG. 6, it is also possible for coupling devices to be embodied additionally or exclusively on the sides of the tempering modules extending parallel to the flow direction, thus permitting a series connection of tempering modules 1 perpendicular to the flow direction, such as in which several parallel conduits are provided. A simple disassembly of the conduit sections 17, 17' and/or the fans 13, 13' in this case contributes to the simple expansion. The fans can also be optionally connected at opposite ends of the tempering unit composed of a plurality of tempering modules 1 when they are arranged in sequence in the flow direction. In a sequential arrangement perpendicular to the flow direction, the fans 13, 13' of the tempering modules 1 remain attached to them and are situated next to one another. With the sequential arrangement of the tempering modules, there are many possibilities for adapting to different requirements of the tempering capacity, and there are possibilities for subsequent expansion, for example when requirements change due to the installation or replacement of components to be cooled.

Figure 7:
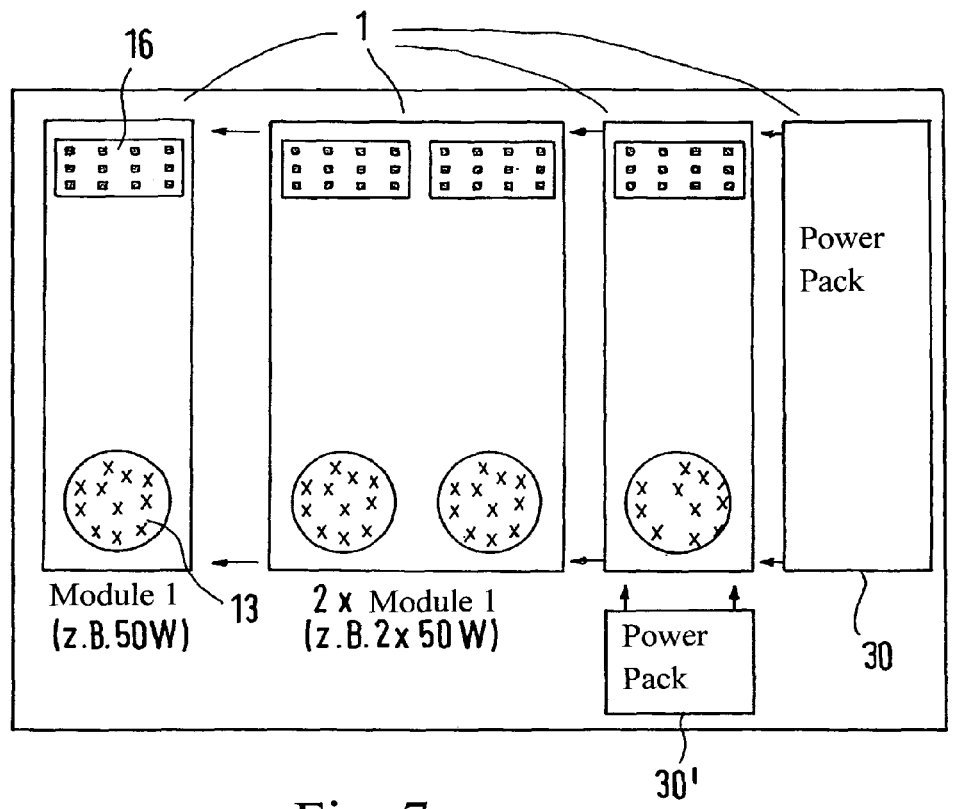
FIG. 7 is a schematic top view of a plurality of tempering modules to be combined into a unit, as well as electrical supply modules to be associated with it.
Figure 8:
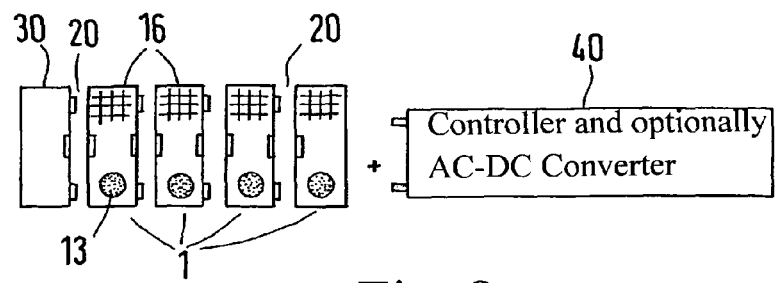
FIG. 8 is a schematic view of a plurality of tempering modules that can be combined into a unit, as well as a control module and an electrical supply module.

The tempering device can also be equipped with one or more power packs that can be easily connected in the form of electric power supply modules 30, 30' to a tempering module 1 or to a group of tempering modules 1, as shown in FIG. 7. In this case, the power supply modules 30, 30' are advantageously provided with a coupling device 20, 20' for a mechanical and/or electrical coupling, as described above in connection with the coupling of tempering modules 1 and schematically depicted in FIG. 8.

In addition, a control unit 40 is provided to control or regulate the tempering and advantageously has at least one control module that is embodied for controlling a varying number of tempering modules 1 and is also able to control only one tempering element, for example, and can also have a monitoring device for this purpose. To permit them to be easily matched to the respective properties and requirements, the control modules have programmable microcontrollers and can also have AC/DC converters and other necessary electrical control components. The control unit 40 in this case can control or regulate the tempering capacity, such as by driving the fans 13, 13' at different speeds and/or by supplying current to the tempering elements until they switch on or switch off. It is thus possible to achieve an extensive, selective control or regulation of the tempering.

By example, FIG. 9 shows several mechanical coupling means 21, 21', such as a screw connection, a snap hook, or a magnetic connection having magnet elements situated on the two tempering modules 1 to be joined to each other, on the power supply module 30, 30', or on the control module 40. A screwless detent connection is also possible. In addition, the electrical coupling components 22, 23 can be embodied as plug/coupling units. It is also possible to provide a frame 25 that includes a plurality of interconnected tempering modules 1, possibly combined with a power supply module 30, 30' and/or a control module 40.

FIG. 10 is a schematic, longitudinal section taken through another exemplary embodiment of the tempering device, with a tempering module 1 mounted externally to a housing wall, such as a back wall 2.1. On the interior of a module housing 5, namely in its housing bottom part 6, a thermoelectric element arrangement is situated, for example equipped with at least one Peltier element 10 whose one side, such as a cold side, is oriented toward the back wall 2.1 and whose other side, such as a hot side, is oriented away from the back wall 2.1. The back wall 2.1 has openings that are positioned so as to correspond to the air inlet opening 14 and the air outlet opening 16 of the tempering module 1 or has a single large opening for them both, through which the air flowing along the Peltier element 10 is conveyed from the interior of the housing 2 and then once cooled, is conveyed back into the housing as indicated by the air flow L, which is produced by the fan 13 situated in the vicinity of the air outlet opening 16. The heat exchangers on the two sides of the Peltier elements 10 through which the air flows L pass have been omitted from the drawing for the sake of better visibility. Also, the air flow L conveyed along the side of the Peltier element 10 oriented away from the back wall 2.1 passes through a corresponding air inlet opening 14' and is conveyed out by a fan 13' in the vicinity of the air outlet opening 16'. The air inlet opening 14' and the air outlet opening 16' are embodied in both end regions of a housing top part 7 that protrudes upward toward the outside.

The middle region of the housing top part that arches up away from the back wall 2.1 covers an intermediate space that is embodied between an intermediate wall 8 in the upper region of the housing bottom part 6 and the inside of the housing top part 7 and accommodates a power pack 42 of a power supply. In addition, the space between the intermediate wall 8 and the covering wall of the housing top part 7 contains optical indicators 43, such as light-emitting diodes or controllable alphanumeric characters. To the side in the housing bottom part 6 toward its narrow side wall, a receiving space is provided in which a controller 41 equipped with a microcontroller is accommodated. This receiving space for the controller 41 of the control unit 40 is formed between a housing insert 9, shown more clearly in FIG. 14, and the inside of the narrow side wall of the housing bottom part 6.

The embodiment of a tempering module schematically depicted in FIG. 10 is shown in greater detail in FIGS. 11 through 14. As clear from the longitudinal section in FIG. 11, in the housing bottom part 6, the cooling conduits 15, 15' are embodied in the housing insert 9 in the form of curved conduits that have partially constricted and partially expanded flow cross-sections so that the air flowing past the Peltier elements 10, in particular past the highly thermally conductive fin-heat exchanger elements 11, 11' attached to them, flows without hindrance and is tempered with a high degree of efficiency.

In this case, the Peltier elements 10 are situated in one or more planes extending parallel to the side walls of the housing bottom part 6. The fins protrude from the hot side of the Peltier elements 10 on the one hand and from their cold side on the other, extending perpendicular to the side walls of the housing bottom part 6 and thus parallel to the bottom 28 of the housing bottom part 6. The intermediate walls of the cooling conduits 15, 15', which are likewise oriented parallel to the sides of the housing bottom part 6, are positioned in the region of or near the Peltier elements 10 and in the same plane as them so that a layered structure of cooling conduits is produced in the region of or near the Peltier elements 10, with conduit layers situated parallel to the side walls of the housing bottom part 6, as shown in FIG. 11. The Peltier elements can be spread out essentially over the entire height of the housing bottom part 6 and of the housing insert 9 inserted into it, in the region of or near the central transverse plane in the longitudinal direction of the module housing 5. Peltier elements 10 that are spaced apart from one another in parallel fashion in relation to the side walls of the housing bottom part 6 are arranged with physically equal sides oriented toward each other, such as hot/hot or cold/cold, so that the intermediate space between two parallel, spaced-apart Peltier elements 10 yields the associated conduit width. The fins of the heat exchange elements 11, 11', which are mounted to the sides of the Peltier elements 10 that face toward each other, with their free ends oriented toward one another, are situated as close to one another as possible in order to have the most effective possible heat exchange with the air passing through. This layered structure of the flow conduits 15, 15' only needs to be present in the region of or near the Peltier elements 10 with the heat exchange elements 11, 11', while the flow conduits 15, 15' in the region of or near the air inlet openings 14, 14' and air outlet openings 16, 16' can extend over the entire width of the housing bottom part 6 or of the housing insert 9 inserted into it and the flow conduits 15, 15' associated with the cold side, such as leading to the electrical cabinet interior, and the hot side, such as leading to the outside, are embodied with wall sections extending perpendicular to the side walls of the housing bottom part 6.

FIG. 11 also shows the fans 13, 13' that are situated in the vicinity of or near the air outlet openings 16, 16' and that in this exemplary embodiment, are embodied in the form of axial fans. In this case, in the housing insert 9, the fan 13' associated with the flow conduit 15' leading outward is oriented with the fan axis inclined in relation to the narrow longitudinal side of the block-shaped module housing 5 and is accommodated in a correspondingly formed recess of the housing insert 9 and fixed in place therein by a detent engagement, for example. The orientation of the fan axis inclined in relation to the narrow side wall, and parallel to the long side walls, matches the direction of the air flow conduit 15' in this region so that at least a significant component of the flow conduit is oriented in the direction of the fan axis and a flow of air is achieved that is as uniform as possible and largely unhindered, with a high air flow rate at a fan power that is as low as possible, thus minimizing the energy demand for the driving of the fan and at the same time, also producing the least possible amount of noise. As shown in FIG. 11, the section extending perpendicular to the side walls of the housing bottom part is also inclined at an angle in relation to the narrow side wall of the module housing and is inclined at approximately the same angle as the fan axis. The air-inlet section of the flow conduit 15' is also oriented toward the inlet opening 14' in a corresponding fashion.

The flow conduit 15 connected to the interior of the housing or electrical cabinet is also formed in a similar way, but the relationship to the interior of the electrical cabinet 2 or housing is taken into account. In this case, however, because of the flat bottom side of the housing bottom part 6 and housing insert 9, the fan situated in the vicinity of or near the air outlet opening 16 of the flow conduit 15 is arranged with its axis perpendicular to the bottom 28 of the housing bottom part 6 for installation reasons. For the flow conduit 15 in the outlet region as well, though, because a conduit wall of the flow conduit 15 is inclined in relation to the narrow side of the housing bottom part 6, there is a significant flow component oriented in the direction of the fan axis, thus also achieving a high air flow rate while requiring a relatively low amount of electrical power for the fan 13. The construction of the flow conduits 15, 15' with an expanded region in the vicinity of the Peltier elements 10 and narrowed regions before and after them produces an efficient tempering with a compact design by deflecting the flow.

As also shown in FIGS. 11 through 14, the air inlet openings 14, 14' and air outlet openings 16, 16' have respective ventilation grilles 27 in order to prevent larger foreign objects from entering the flow path. When required under certain operating conditions, it is also possible to use coarser or finer filter pads, particularly in the region of or near the ventilation grilles 27. In the region of or near the dome-like housing top part 7, the ventilation grilles 27 can be arranged in combination with fan filter pads in separately removable, detent-engaged inserts 26 so that they can be easily replaced. The housing top part 7, which is essentially trapezoidal in its longitudinal section or alternatively is arched convexly outward, has inserts 26 at the two lateral end regions forming the inclined lateral surfaces in the trapezoidal shape, which also contain the relevant air inlet opening 14' or air outlet opening 16', respectively, optionally provided with the associated fan 13'.

The above-mentioned design of the module housing 5 with the housing bottom part 6, housing top part 7, intermediate wall 8, fans 13, 13', and the design of the flow conduits 15, 15', air inlet openings 14, 14', and air outlet openings 16, 16' are also visible in the views shown in FIGS. 13A through 13G.

Figure 14:
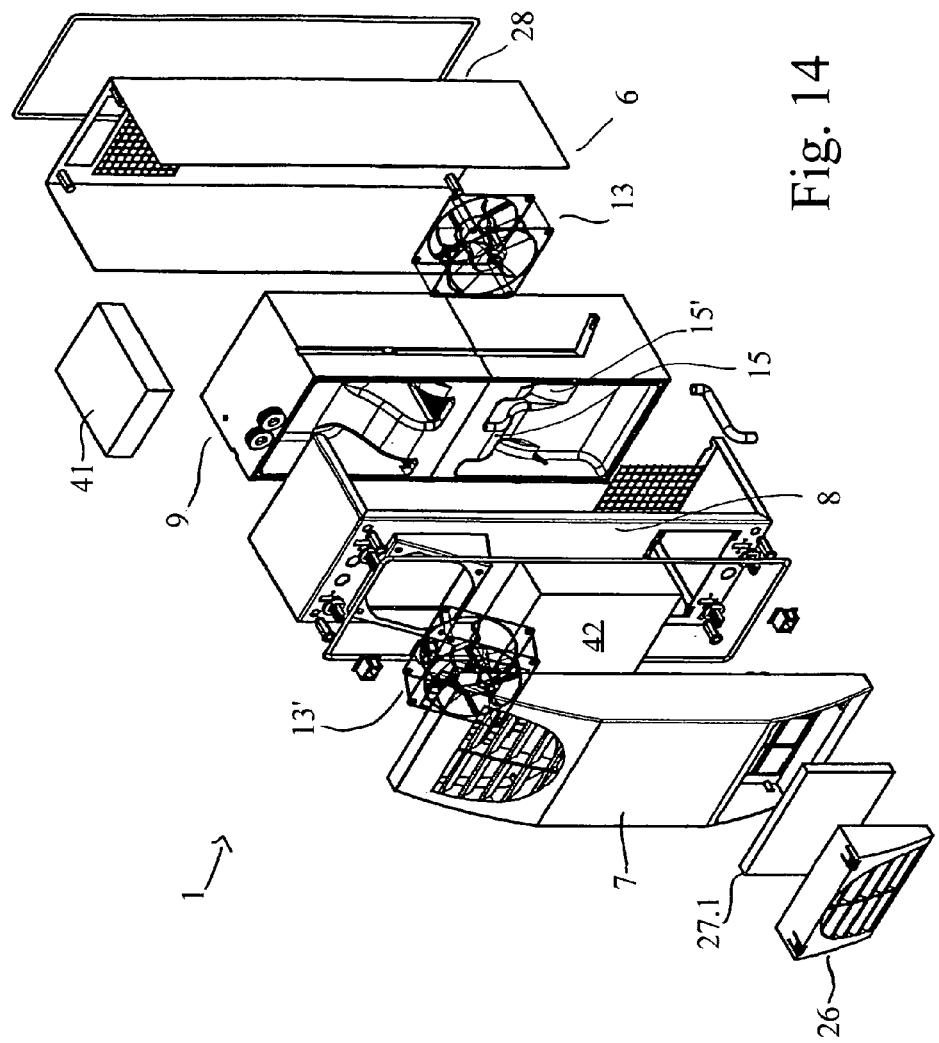
FIG. 14 is an exploded perspective view of the tempering module according to FIG. 11.

The design of the module housing 5 with the housing bottom part 6, housing top part 7, and housing insert 9 with the associated fans 13, 13' is shown in detail in FIG. 14, which also shows the insertion of the fans 13, 13', the air inlet openings 14, 14', and air outlet openings 16, 16', with the respective ventilation grilles 27 and optionally, fan filter pads 27.1 and the inserts 26 of the housing top part 7. The drawing also shows the arrangement of the flow conduits 15, 15' provided in the housing insert 9, which are layered in relation to the side wall of the housing bottom part 6, with the flow conduit 15 situated in the middle in the transverse direction and two sections of the flow conduit 15', corresponding to the associated outside of the Peltier elements 10, situated in the regions adjoining the sides. In addition, sealing elements are situated between the essential components of the housing bottom part 6 and the housing top part 7. The housing insert 9 can be manufactured out of heat-resistant plastic while the housing bottom part 6 is manufactured out of metal, for example, and the housing top part 9 is likewise manufactured out of plastic. The housing bottom part 6 has a lower section with a U-shaped cross-section, with a bottom 28 and side walls, while an upper section of the housing bottom part 6 has the intermediate wall 8 with corresponding openings for the air inlet opening 14' and air outlet opening 16' as well as two narrow side walls of the block-shaped housing bottom part 6.

Figure 15:
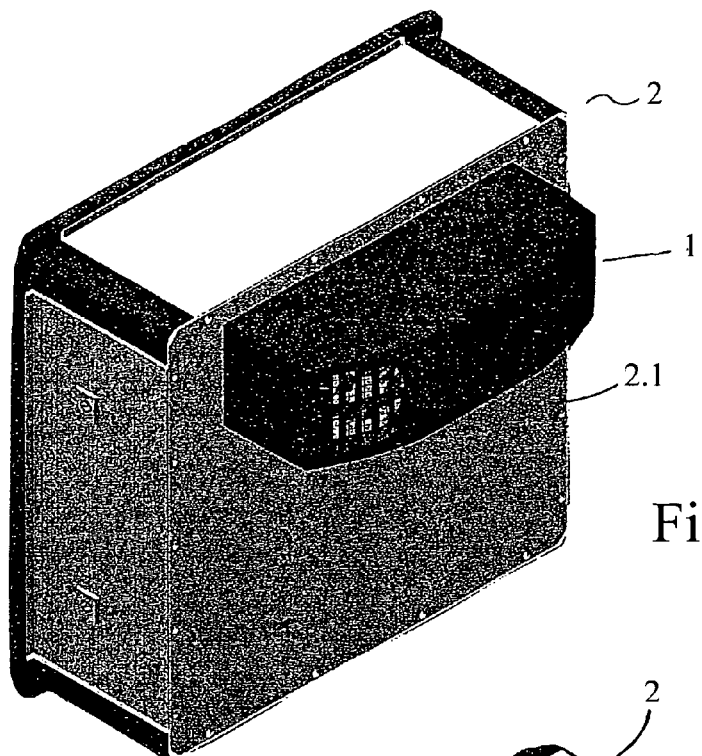
FIG. 15 is a perspective view of the tempering module in a state in which it is mounted on a housing.
Figure 16:
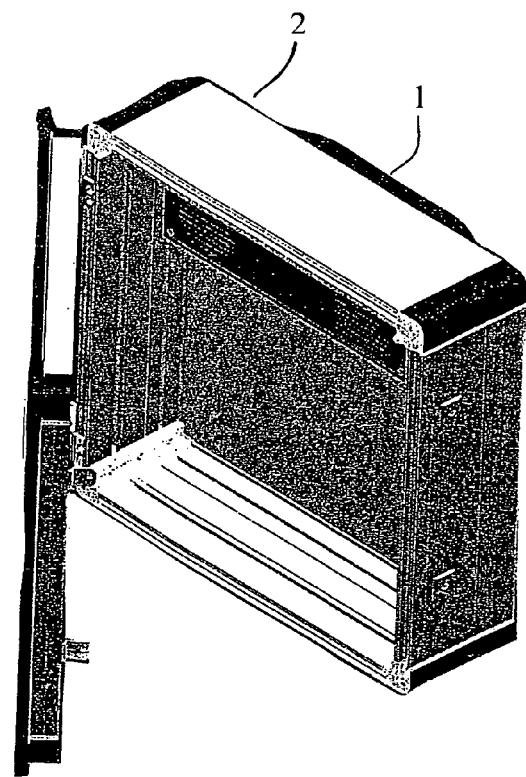
FIG. 16 shows the housing according to FIG. 15 with the mounted tempering module, looking into an interior of the housing with the door open.

As shown in FIG. 15, a tempering module 1 can be mounted with its bottom 28 directly against the outside, such as back wall 2.1 of the housing 2, with openings provided in the back wall 2.1 that correspond to the air inlet opening 14 and air outlet opening 16. In this embodiment, the entire interior of the housing 2 is largely available for built-in equipment, as also shown in FIG. 16.

Figure 17:
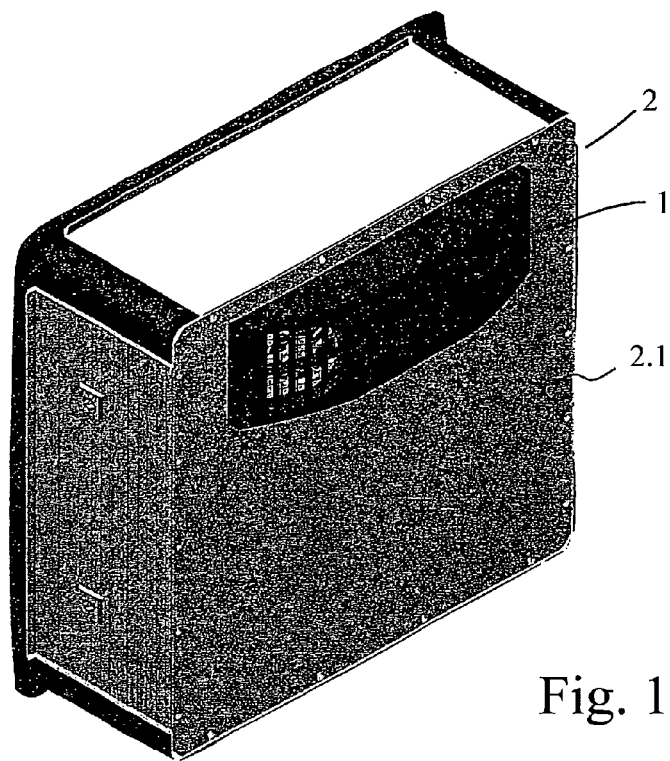
FIG. 17 is a perspective view of a tempering module installed in a housing that is complete except for a top part.

In the exemplary embodiment according to FIG. 17, however, the tempering module 1 is inserted, except for the housing top part 7, from the outside into the interior of the housing 2, into a correspondingly embodied opening in the back wall 2.1. Consequently, the tempering devices according to the exemplary embodiments shown in FIGS. 10 through 17 are also suitable for mounting on or installing in housings or electrical cabinets. In this case, a plurality of such fan units can be arranged parallel to one another, with their longitudinal sides next one another, in order to achieve various tempering capacities.

Figure 18:
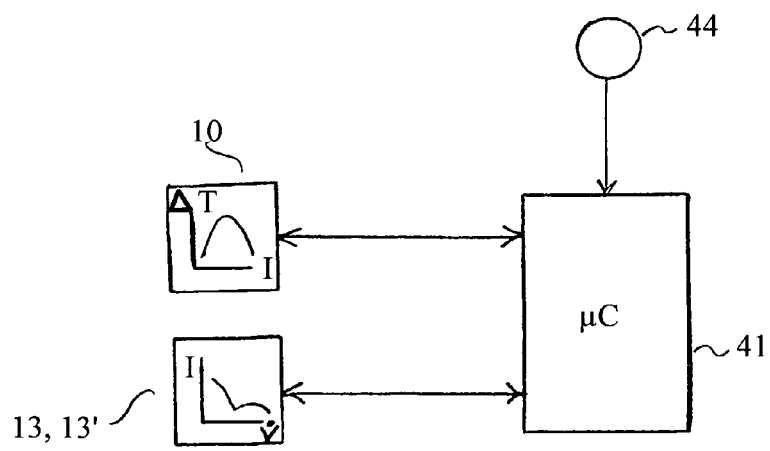
FIG. 18 is a schematic block circuit diagram of a control unit for the tempering device.

FIG. 18 shows an exemplary embodiment for the control unit 40 of a tempering module 1 or a combination of a plurality of tempering modules. The control unit can, for example, have a controller embodied in the above-described fashion, situated between the inside of the housing top part 7 and the top side of the intermediate wall 8 and/or a controller 41 or situated between the narrow side of the housing insert 9 and the narrow side of the housing bottom part 6. The controller 41 can have a programmable microcontroller. The microcontroller has a program stored in it for controlling the tempering module 1 through the way in which it drives the fans 13, 13' and Peltier elements 10. It drives them as a function of sensor signals that are supplied by a sensor unit 44, in particular temperature signals, humidity, volume of the space to be cooled, and the like. Tables with setting parameters that are calculated in the program in accordance with predetermined criteria can also be stored in a memory unit in the controller 41 or the correspondingly embodied microcontroller 41. The supply of electrical energy to the fans 13, 13' and Peltier elements 10 is preferably carried out by the power pack 42 that is situated in the receiving space between the housing top part 7 and the intermediate wall 8. As a rule, a particular supply voltage is predetermined, such as 24V, while the required tempering capacity, cooling capacity, or heating capacity is likewise controlled or regulated in the most energy-efficient way possible as a function of environmental parameters and sensor signals through optimized driving of the Peltier elements 10 and fans 13, 13'. Thus, the drive characteristics of the fans 13, 13' and Peltier elements 10 are set into relation with each other in the controller and an energy-optimized driving of these elements is selected. This is based on the fact that the Peltier elements 10 permit a maximum temperature difference between the hot side and the cold side in a particular current/drive range and the fans are designed so that the volume flow rate of the fans reaches an optimum as a function of the electrical current, adapted to the characteristic curve of the Peltier elements and the adapted geometry of the flow conduits.

The invention claimed is:

1. A thermoelectric tempering device having a plurality of thermoelectrically operating tempering elements (10), with a first side comprising a cold surface and an opposite side comprising a hot surface; air/heat exchange elements (11, 11') affixed to both sides and each accommodated in a flow conduit wherein each respective flow conduit (15, 15') is constructed so that each flow conduit encompasses the respective heat exchange elements (11, 11') in a flow direction; ventilators (13, 13') producing an air flow along the air/heat exchange elements, a housing (5) with a housing bottom part (6) and a housing top part (7), wherein the housing has at least one air inlet opening (14, 14") and at least one air outlet opening (16, 16"), and wherein the ventilator (13, 13") of each respective flow conduit (15, 15") is situated at a respective inlet opening (14, 14") or outlet opening (16, 16") and wherein the air outlet opening and the air inlet opening are connected via the respective flow conduit, wherein the housing bottom part (6) has a detachably mounted housing bottom (28) on an underside and is covered on an opposite surface by the housing top part (7), and the flow conduits are formed of curved channels having partially constricted and partially expanded flow cross-sections, wherein the flow conduits are oriented parallel to the sides of the housing bottom part and positioned in the region of or near the tempering elements and in the same plane as the tempering elements so that a layered structure of flow conduits is produced, and wherein the partially constricted cross-sections exist before and after the tempering elements and the partially expanded regions are positioned in the space between either the housing bottom or the housing top part and the tempering elements.

2. The tempering device as recited in claim 1, wherein the fans (13, 13') are integrated next to the relevant heat exchange element (11, 11'), both on a same side of the tempering module (1) or on an opposite side.

3. The tempering device as recited in claim 2, wherein the fans (13, 13') are radial fans with a radial flow opening oriented toward the respective heat exchange element (11, 11') and an axial flow opening oriented perpendicular to a flat side of the tempering elements (10), or the fans (13, 13') are axial fans and the respective flow conduit (11, 11') in a region oriented toward a respective axial fan has a directional component oriented in the axial direction of the axial fan.

4. The tempering device as recited in claim 3, wherein for the associated flow conduit (15, 15') the fans (13, 13') are blowing fans, are suction fans, or one is a suction fan and the other is a blowing fan.

5. The tempering device as recited in claim 4, wherein the air flows in opposite directions or in a same direction through the flow conduit (11 or 11') associated with the cold surface and the flow conduit (11' or 11) associated with the hot surface.

6. The tempering device as recited in claim 5, wherein the heat exchange elements (11, 11') have fins oriented perpendicular to the cold surface or the hot surface and parallel to the flow of air through the respective flow conduit.

7. The tempering device as recited in claim 6, wherein a tempering module (1) has a coupling device (20) in at least one edge section near a circumference edge, by which it is possible to attach an additional tempering module (1) having a complementary coupling device (20').

8. The tempering device as recited in claim 1, wherein a tempering module (1) has a coupling device (20) in an edge section and a complementary coupling device (20') in an other edge section.

9. The tempering device as recited in claim 8, wherein the coupling device (20) has a mechanical coupling (21, 21') and electrical coupling components (22, 23).

10. The tempering device as recited in claim 9, wherein the electrical coupling components (22, 23) have at least one plug/coupling unit for electrically coupling signal lines and/or power supply lines.

11. The tempering device as recited in claim 10, wherein the mechanical coupling (21, 21') has plug connection elements, detent connection elements, screw connection elements, and/or magnetic connection elements.

12. The tempering device as recited in claim 11, wherein a control unit is electrically connected or connectable to at least one tempering module (1) for controlling a tempering module (1) and/or a plurality of tempering modules (1) in connection with different levels of tempering capacity.

13. The tempering device as recited in claim 12, wherein the control unit controls or regulates different tempering capacities by driving the fans (13, 13') at different speeds and/or by varying a power supply to the tempering elements (10).

14. The tempering device as recited in claim 13, wherein the control unit controls the tempering modules (1) differently from one another.

15. The tempering device as recited in claim 14, wherein the control unit drives the fans (13, 13') with different levels of electrical power and drives the tempering elements (10) with different levels of electrical power to meet various tempering capacity requirements and the driving of the fans (13, 13') and the driving of the tempering elements (10) are matched to each other to minimize a total electrical power demand for driving the fans (13, 13') and the tempering elements (10) at a respective tempering capacity.

16. The tempering device as recited in claim 15, wherein the control unit has at least one controller (41) formed as a microcontroller with programs stored for producing the signals for driving the fans (13, 13') and the tempering elements (10) as a function of sensor signals that communicate the tempering capacity requirement.

17. The tempering device as recited in claim 16, wherein an electric power supply with at least one power supply module (30, 30') selectively supplies power to a single tempering module (1) or to a group of tempering modules (1).

18. The tempering device as recited in claim 15, wherein the control unit has at least one control module (40) with a housing and the control module (40) and/or the power supply module (30, 30') each has a coupling device (20) for electrically coupling and/or mechanically coupling to one more of the tempering modules (1).

19. The tempering device as recited in claim 18, wherein the housing top part (7) protrudes outward as a dome on top and in a longitudinal section is trapezoidal or arched convexly outward and between a middle section of the housing top part (7) and an intermediate wall (8) in the upper region of the housing bottom part oriented toward the housing top part, a receiving chamber is provided in which an electric power supply or a power pack (42) is accommodated.

20. The tempering device as recited in claim 19, wherein a housing insert (9) having block-shaped outer contours contains the flow conduits (15, 15') and is inserted into the housing bottom part (7).

21. The tempering device as recited in claim 20, wherein the housing insert (9) is shortened in a longitudinal direction in comparison to the housing bottom part (7) and the controller (41) is in a space between an outside of the housing insert (9) and an inside of the housing bottom part (7) oriented toward it.

22. The tempering device as recited in claim 21, wherein an optical indicator is installed in an upper covering wall of the housing top part (7).

23. The tempering device as recited in claim 1, wherein the fans (13, 13') are radial fans with a radial flow opening oriented toward the respective heat exchange element (11, 11') and an axial flow opening oriented perpendicular to a flat side of the tempering elements (10), or the fans (13, 13') are axial fans and the respective flow conduit (11, 11') in a region oriented toward a respective axial fan has a directional component oriented in the axial direction of the axial fan.

24. The tempering device as recited in claim 1, wherein for the associated flow conduit (15, 15') the fans (13, 13') are blowing fans, are suction fans, or one is a suction fan and the other is a blowing fan.

25. The tempering device as recited in claim 1, wherein the air flows in opposite directions or in a same direction through the flow conduit (11 or 11') associated with the cold surface and the flow conduit (11' or 11) associated with the hot surface.

26. The tempering device as recited in claim 1, wherein the heat exchange elements (11, 11') have fins oriented perpendicular to the cold surface or the hot surface and parallel to the flow of air through the respective flow conduit.

27. The tempering device as recited in claim 1, wherein a tempering module (1) has a coupling device (20) in at least one edge section near a circumference edge, by which it is possible to attach an additional tempering module (1) having a complementary coupling device (20').

28. The tempering device as recited in claim 1, wherein a coupling device (20) has a mechanical coupling (21, 21') and electrical coupling components (22, 23).

29. The tempering device as recited in claim 9, wherein the mechanical coupling (21, 21') has plug connection elements, detent connection elements, screw connection elements, and/or magnetic connection elements.

30. The tempering device as recited in claim 1, wherein a control unit is electrically connected or connectable to at least one tempering module (1) for controlling the tempering module (1) and/or a plurality of the tempering modules (1) in connection with different levels of tempering capacity.

31. The tempering device as recited in claim 12, wherein the control unit controls the tempering modules (1) differently from one another.

32. The tempering device as recited in claim 12, wherein the control unit drives the fans (13, 13') with different levels of electrical power and drives the tempering elements (10) with different levels of electrical power to meet various tempering capacity requirements and the driving of the fans (13, 13') and the driving of the tempering elements (10) are matched to each other to minimize a total electrical power demand for driving the fans (13, 13') and the tempering elements (10) at a respective tempering capacity.

33. The tempering device as recited in claim 12, wherein the control unit has at least one controller (41) formed as a microcontroller with programs stored for producing the signals for driving the fans (13, 13') and the tempering elements (10) as a function of sensor signals that communicate the tempering capacity requirement.

34. The tempering device as recited in claim 1, wherein an electric power supply with at least one power supply module (30, 30') selectively supplies power to a single tempering module (1) or to a group of tempering modules (1).

35. The tempering device as recited in claim 12, wherein the control unit has at least one control module (40) with a housing, and the control module (40) and/or the power supply module (30, 30') each has a coupling device (20) for electrically coupling and/or mechanically coupling to one more of the tempering modules (1).

36. The tempering device as recited in claim 1, wherein the housing top part (7) protrudes outward as a dome on top and in a longitudinal section is trapezoidal or arched convexly outward and between a middle section of the housing top part (7) and an intermediate wall (8) in the upper region of the housing bottom part oriented toward the housing top part, a receiving chamber is provided in which an electric power supply or a power pack (42) is accommodated.

37. The tempering device as recited in claim 1, wherein a housing insert (9) having block-shaped outer contours contains the flow conduits (15, 15') and is inserted into the housing bottom part (7).

38. The tempering device as recited in claim 1, wherein an optical indicator is installed in an upper covering wall of the housing top part (7).

* * * * *